(12) United States Patent
Huang et al.

(10) Patent No.: US 6,218,731 B1
(45) Date of Patent: Apr. 17, 2001

(54) TINY BALL GRID ARRAY PACKAGE

(75) Inventors: Chien-Ping Huang, Hsinchu Hsien; Tzong-Dar Her, Taichung; Kevin Chiang, Taichung Hsien, all of (TW)

(73) Assignee: Siliconware Precision Industries Co., Ltd., Taichung Hsien (TW)

( * ) Notice: Subject to any disclaimer, the term of this patent is extended or adjusted under 35 U.S.C. 154(b) by 0 days.

(21) Appl. No.: 09/383,835

(22) Filed: Aug. 26, 1999

(30) Foreign Application Priority Data

May 21, 1999 (TW) ................................................. 88108359

(51) Int. Cl.[7] .................................................... H01L 23/48
(52) U.S. Cl. ........................ 257/738; 257/678; 257/684; 257/687; 257/693; 257/698; 257/701; 257/707; 257/777; 257/778; 257/779; 257/780; 257/781; 257/782; 257/783; 257/784
(58) Field of Search ..................................... 257/678, 684, 257/687, 693, 698, 701, 707, 777–784, 738

(56) References Cited

U.S. PATENT DOCUMENTS 5,677,575 * 10/1997 Maeta et al. ........................ 257/783
5,731,709 * 3/1998 Pastore et al. ...................... 324/765

* cited by examiner

Primary Examiner—Fetsum Abraham
(74) Attorney, Agent, or Firm—Jiawei Huang; J.C. Patents

(57) ABSTRACT

A tiny ball grid array package based on a substrate. The substrate has at least an insulation layer and two copper foils laminated together. A hole is formed near the center of the substrate. A second one of the copper foils is patterned into multiple conductive traces formed on a surface of the substrate, while a first one of the copper foils has a surface partly exposed. The first copper foil is coupled with the conductive traces by vias, meanwhile, the first copper foil is grounded to form a ground plane, so as to improve the electrically properties and the heat dissipation efficiency. Bonding pads are formed in one surface of a chip. This surface is thermal-conductively connected to the grounded level, and the bonding pads are located in the hole. The bonding pads are electrically connected to a near end of a conductive trace by a conductive wire, and solder balls are attached at a far end of the conductive trace. A molding material fills the hole and covers a surrounding area of the hole to protect the bonding pads, the conductive wire, and the conductive traces, so as to cover a junction area of the chip and the ground plane.

24 Claims, 3 Drawing Sheets

TINY BALL GRID ARRAY PACKAGE

CROSS-REFERENCE TO RELATED APPLICATION

This application claims the priority benefit of Taiwan application serial no. 88108359, filed May 21, 1999, the full disclosure of which is incorporated herein by reference.

BACKGROUND OF THE INVENTION

1. Field of the Invention

The invention relates to a tiny ball grid array package, and more particularly, to a tiny ball grid array package with an improved thermal and electrical performance.

2. Description of the Related Art

In an integrated circuit, signal lines formed upon the silicon substrate to be connected to external devices are terminated at flat metal contact regions called input/output (I/O) pads. The integrated circuit is then secured within a protective semiconductor device package. Each of the I/O pads of the chip is then connected to one or more terminals of a device package. The terminals of a device package are typically arranged about the periphery of the package. Fine metal wires are typically used to connect the I/O pads of the chip of the terminals of the device package. Some types of device packages have terminals called pins for insertion into holes in a printed circuit board (PCB). Other types of device packages have terminals called "leads" for attachment to flat metal contact regions on an exposed surface of a PCB.

As the semiconductor technique has been updated with an increasingly higher integration and speed, the fabrication technique with a linewidth of about 0.18 micron has been achieved in mass production. The objective of being "compact, thin and light", has been a leading trend for the development of various aspects of semiconductor fabrication, including package technique. In addition, in view of operating an electronic device with increasingly higher operating speed, how to comply with the effect caused by the improved high frequency in package and how to improve heat dissipation are important topics in factory, as well.

FIG. 1 shows a schematic, cross-sectional structure of a conventional lead on chip package. The lead on chip package is commonly applied in a thin small outline package (TSOP). The lead on chip package uses a lead frame 24, which has a different structure from normal lead frames. The lead frame 24 comprises only multiple leads 10. A chip 12 has a surface 14 comprising bonding pads 16 which surface 14 is directly adhered onto the leads 10 using, for example, a double adhesive polyimide tape 18. The bonding pads 16 are disposed in positions on the surface 14 and near central portion of the surface 14. Each bonding pad 16 is coupled to one conductive wire 20 and a lead 10. A package material 22 encloses the chip 12, the conductive wire 20, and the connecting regions between leads 10 and bonding pads 16. In the lead on chip package structure, the usage of die pad is saved to result in a reduced package area and volume. By directly adhering the chip to the leads, a better heat dissipation path is provided. However, due to restriction imposed by a pitch inherent to the lead frame, it is difficult to effectively reduce the package size for high pin count devices. It is also difficult to resolve the high frequency inductance effect.

FIG. 2 shows a schematic, cross-sectional view of another conventional lead on chip package. The package structure shown in FIG. 2 is also called a tiny ball grid array or a thin and fine ball grid array. A ball grid array substrate is used as a carrier. A single layer of a ball grid array substrate 34 laminated with an inner layer of resin 30 and a copper foil 32 is used in the conventional structure. The inner layer 30 has an aperture 42 near a center thereof. The copper foil 32 is disposed on a surface 40 of the inner layer 30, and patterned into conductive traces 31. A surface 14 comprising bonding pads 16 of the chip 12 is adhered onto another surface 38 of the inner layer 30 using adhesive 44. The bonding pads 16 are formed on the chip 12 near a center thereof. When the chip 12 and the inner layer 30 are adhered to each other, the bonding pads 16 are aligned with the aperture 42. When a bonding process is performed to connect the bonding pads 16 and a near end 31a of the conductive trace 31 with bonding wires 20 going through the aperture 42. The connection of the bonding wires 20 and the conductive trace 31a is then sealed in a package material 22 to protect the adhering parts of the chip 12 and the ball grid array substrate 34. A far end 31b of the conductive trace 31 has another terminal having solder balls 36 disposed thereon to provide a connection to an external circuit, for example, such as a terminal for transferring a signal to a printed circuit board.

The above lead on chip package structure uses a ball grid array substrate instead of a conventional lead frame to reduce the pitch and size. However, heat is mainly generated from a surface comprising semiconductor devices which is taped with an inner layer, so that the effect heat dissipation is poor and degrades the performance of products. To effectively resolve the problems of heat dissipation, a heat sink is required on the chip to increase the cost of products. On the other hand, since the pitch between wires is smaller, the inductance effect is more obvious for a high frequency operation. The interference of signal becomes more serious and degrades the performance of products.

SUMMARY OF THE INVENTION

The invention provides a tiny ball grid array package in which a chip is directly adhered onto a copper layer, so that the heat dissipation efficiency is improved.

In the tiny ball grid array package provided by the invention, a ground plane is formed to reduce the signal transmission path and suppress the occurrence of a signal noise. Mutual induction can also be reduced to shorten the signal delay time.

The invention provides a tiny ball grid array package structure on a substrate comprising at least an insulation layer and two copper layers laminated on each surface of the insulation layer. The substrate has a central hollow portion. A second copper layer of these two copper layers is patterned into multiple conductive traces and disposed on a surface of the substrate. A surface of the first copper layer is partially exposed and electrically connected to the conductive traces by vias, so as to be grounded to form a ground plane. The chip has a surface comprising bonding pads near the central hollow. The surface of the chip is thermal-conductively connected with the ground plane. The bonding pads are located within the hollow portion. The bonding pads are electrically connected to a near end of the conductive traces by a conductive wire, while a far end of the conductive traces is implanted with solder balls. The hollow portion and an area surrounding the hollow portion is filled with a molding material to protect the bonding pads, the conductive wire and the conductive traces, and does so by covering a junction area of the chip and the ground plane.

According to the invention, the substrate comprises a dual layer plate. Two copper layers are laminated onto two surfaces of an insulation layer, respectively. When a lamination of more than three copper layers is used, a ground plane is preferably disposed on other coppers layers. The first copper layer is connected to ground to form a ground plane. Thus, the signal transmission path can be reduced with a reduced mutual inductance. Under a high operation frequency, the inductance effect and signal delay can be improved. In addition, by directly connecting the chip with the ground plane, an enhanced heat dissipation path is provided.

Both the foregoing general description and the following detailed description are exemplary and explanatory only and are not restrictive of the invention, as claimed.

DESCRIPTION OF THE PREFERRED EMBODIMENTS

First Embodiment

Figure 1:
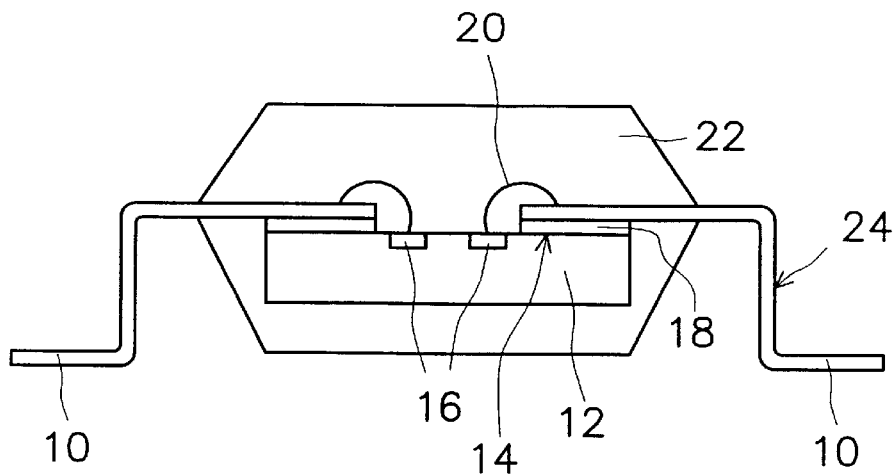
FIG. 1 shows a schematic, cross-sectional view of a conventional lead on chip package structure.
Figure 2:
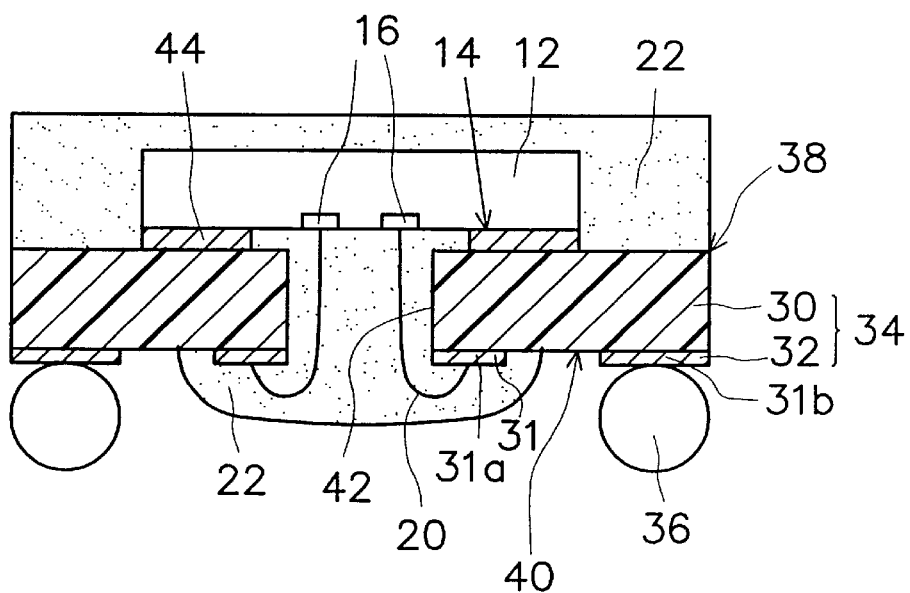
FIG. 2 is a schematic, cross-sectional view showing another conventional lead on chip package structure.
Figure 3A:
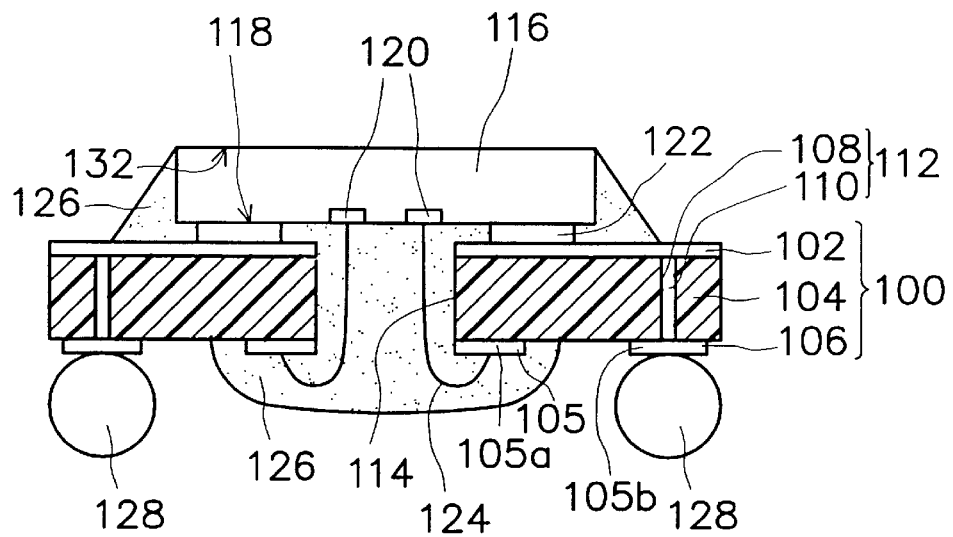
FIG. 3A is a schematic, cross-sectional view showing an embodiment of a tiny ball grid array package having a chip exposed.
Figure 3:
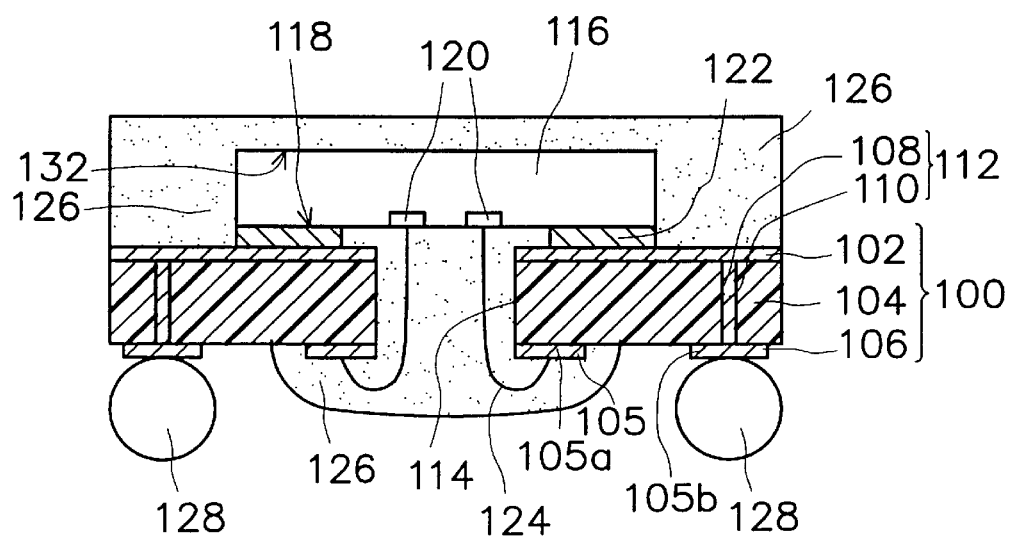
FIG. 3 is a schematic, cross-sectional view showing a tiny ball grid array package structure in an embodiment according to the invention.

Reference is made to FIG. 3, in which a schematic drawing of a tiny ball grid array is shown. In this embodiment, a laminate substrate comprising two copper foils is used as an example of a ball grid array substrate and is sometimes referred to a dual layer plate. Package structures based on this kind of substrate are typically used for integrated circuits having fewer pins. The substrate 100 is a lamination of an inner layer of resin 104 sandwiched between a first copper layer 102 and a second copper layer 106. The inner layer 104 comprises glass epoxy (FR-4, FR-5), bismaleimide-triazine (BT), or other resin. Using photolithography and etching processes, the copper layer 106 is patterned as conductive traces 105. The electrical connection between the copper layers 102 and 106 are achieved by formation of a via 112 penetrating through the inner layer 104. A metal layer 108, for example, a copper layer, is coated on a surface of the via 112. The via 112 further comprises a filling material 110. The copper layers 102 and 106 on opposite surfaces of the inner layer 104 can be connected by the coating material layer 108. A chip 116 having a surface 118 comprising devices (not shown) formed thereon and an opposite surface referred as a rear surface is provided. A hole or an aperture 114 is formed to penetrate through a central portion of the substrate 100. Bonding pads 120 are formed on the chip surface 118. The surface 118 of the chip 116 is adhered onto the ground plane of the first copper layer 102 using an adhesive 122 having a good heat conductance and flexibility, such as a thermally conductive paste or tape. Thus, the chip 116 is affixed on the copper layer 102 with the bonding pads 120 located and exposed within the aperture 114. Using wire bonding technique, the bonding pads 120 are connected with a near end 105a of the conductive traces 105 via conductive wires 124, such as gold wire, aluminum wire, or copper wire. The conductive traces 105 have a far end 105b having solder balls 128, such as tin balls, thereon. The aperture 114 is then filled with molding material 126. The molding material 126 not only covers and protects elements such as the bonding pads 120, the conductive wires 124, and a portion of the conductive traces 105a, but also covers a junction area of the chip 116 and the first copper layer 102.

In the above package structure, the first copper layer 102 can be electrically connected to a ground of a printed circuit board (PCB) by means of the via 112, the conductive traces 105 and the solder balls 128. Meanwhile, an equivalent potential level of the first copper layer 102 is reached to reduce distance between the signal node of the 116 chip and the ground plane. The reduction in signal path results in an effective series inductance and mutual inductance between wires. The problems of the inductance effect while raising operation frequency can thus be improved; in addition, the noise of signal can also be reduced. Moreover, the relationship between propagation delay $t_{pd}$ of signal and inductance L and capacitance C of a wire can be described by:

$$t_{pd} = \sqrt{L \cdot C}$$

Therefore, since the package structure provided in the invention has a reduced inductance, the propagation delay of signal is subsequently reduced. An improved performance can thus be obtained.

Furthermore, the heat generated while operating the chip 116 is mainly dissipated from the surface 118, when the surface 118 is adhered onto the first copper layer 102, the heat can be spread out by way of the first copper layer 102 which has a good thermal conductivity. In addition to the first copper layer 102, the heat can further be dissipated through the via 112, the conductive traces 105 and the solder balls 128, which are all made of materials with good thermal conductivity, to the printed circuit board. To further improve the efficiency of heat spread, the rear surface 132 of the chip 116 can be designed to be exposed by the molding material as shown in FIG. 3A.

Second Embodiment

Figure 4:
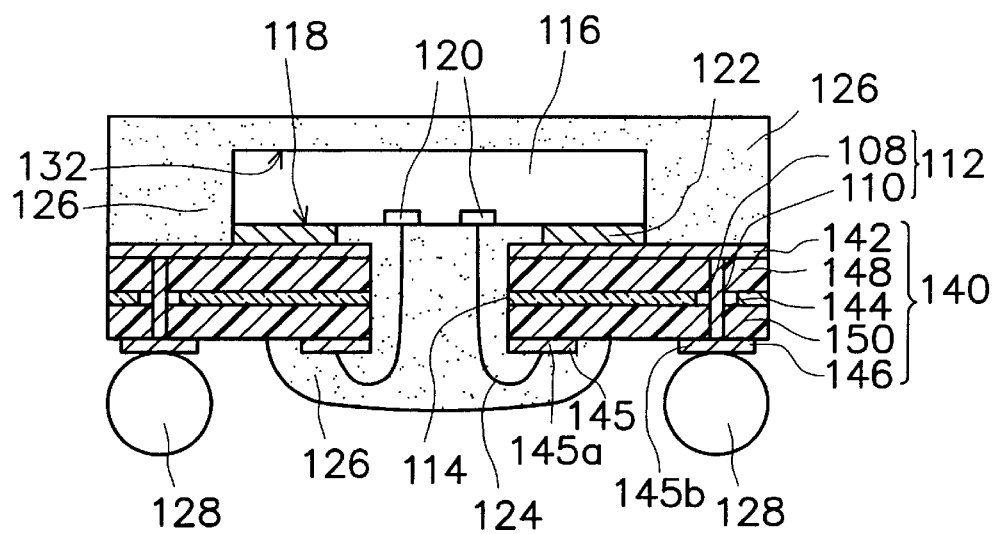
FIG. 4 shows a tiny ball grid array package structure in another embodiment according to the invention.

FIG. 4 shows a second embodiment of a tiny ball grid array package structure according to the invention. In this embodiment, a ball grid array substrate 140 comprises a laminate substrate of three copper layers. The substrate 140 comprises a first copper layer 142, a second copper layer 144 and a third copper layer 146 with two insulation layers 148, 150 alternatively laminated between them. The insulation inner layers 148 and 150 are made of materials such as FR-4, FR-5 or BT. In a photolithography and etching step, the third copper layer 146 is patterned to form conductive traces 145. The first copper layer 142 on top of the other layers is preferably selected as a ground plane. The second copper layer 144 is electrically connected to the conductive traces 145 by a via (not shown in the figure), so as to connect to a power source. This arrangement effectively reduces inductance of the conductive traces 145 on the copper layers 146. Using a via 112, the first copper layer 142 is electrically connected to the conductive traces 145, and thus, to a ground. The via 112 comprises a filling material 110 and a conductive coating layer 108, for example, a copper layer on a surface of the via 112 to connect copper layers at either ends of the ia 112.

The substrate 140 has an aperture 114 near a center thereof. The aperture 114 penetrates through inner layer 148 and 150 to provide a space for wire bonding. A chip 116 is adhered onto the first copper layer 142 with a surface comprising devices (not shown) and bonding pads 120 formed therein. An adhering material 122, for example, thermally conductive paste or tape, is selected to provide good heat conductance. The chip 116 is thus affixed on the copper layer 142. The bonding pads 120 can be connected to near ends 145a of the conductive traces 145 via a bonding wire 124 made of, for example, gold wire, aluminum wire, or copper wire. Conductive balls 128 such as tin balls are formed on far ends 145b of the conductive traces 145. The aperture 114 is then filled with a molding material 126, so as to cover the bonding pads 120, the bonding wires 124, a part of the conductive traces 145a, and the joint of the chip 116 and the copper layer 142, for which structures the molding material 126 serves as a protection layer.

Third Embodiment

Figure 5:
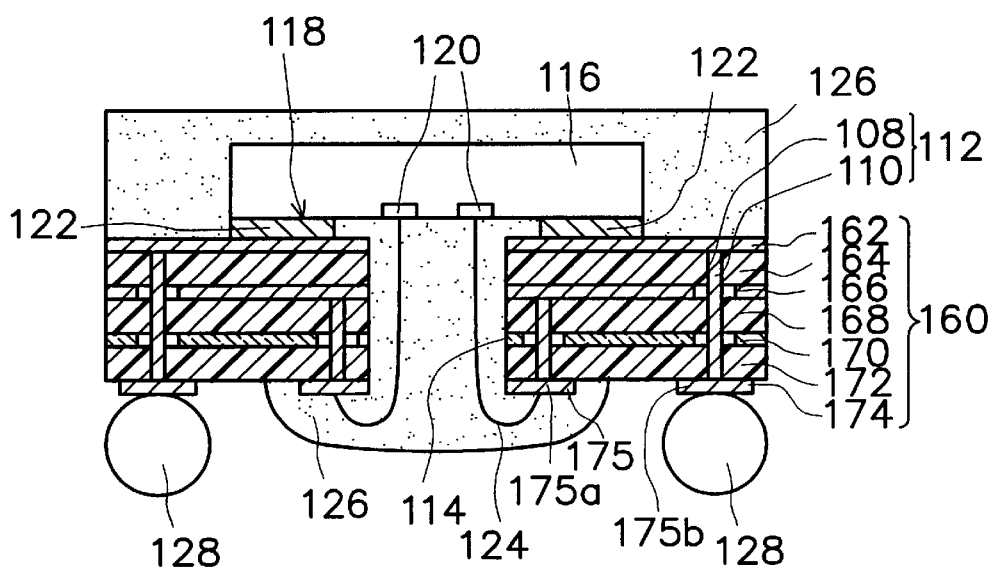
FIG. 5 is a schematic, cross-sectional view showing a tiny ball grid array package structure according to the other embodiment according to the invention.

In FIG. 5, a schematic, cross-sectional view of a tiny ball grid array according to the third embodiment of the invention is shown. A substrate comprising four laminated copper layers is used as an example. A multiple layer substrate based on assembly of the dual layer plate as described in the first embodiment is easier to fabricate since the dual layer plate has reached the mass production stage. In contrast, fabrication of a three layer plate is relatively difficult due to a laborious technique for laminating another copper layer onto a dual layer plate. The substrate 160 comprises three insulation layers 164, 168, 172 alternatively laminated with four copper layers, a first copper layer 162, a second copper layer 166, a third copper layer 170, and a fourth copper layer 174. The insulation layers 164, 168 and 172 may be made of materials such as FR-4, FR-5 or BT. Using photolithography and etching step, the fourth copper layer 174 is patterned to form conductive traces 175. The second copper layer 166 may also be patterned to achieve the circuit layout of the integrated circuits, so as to increase the input/output (I/O) terminals. By the formation of vias (not shown) and the conductive traces 175, a multi-layer electrical connection between the wires can be achieved. Since copper has good heat conductivity, the copper layer 162 itself provides a good heat spreading path. The copper layer 162 can be coupled with the chip to effectively dissipate the heat generated by the chip 116. The copper 162 may additionally be connected with a heat sink or heat slug to further dissipate the heat. The copper layer disposed in the middle of the substrate 160, that is, the first and the third copper layers 162 and 170 as shown in the figure, are a preferable selection for a ground plane or a source plane. Alternatively, the copper layer 166 can also be used as a ground plane or a source plane. Therefore, the inductance between of the copper layers 174, 166 and the conductive traces is reduced effectively. The first copper layer 162 is electrically connected by a via 112 to the fourth copper layer 174, and the third copper layer 170 is also electrically connected to the fourth copper layer 174, so as to couple to a power source. The via 112 comprises a conductive filling material 110 wrapped with an electroplating layer 108, such as a copper layer. In such manner, the copper layer at two ends of the via 112 can be electrically connected.

The substrate 160 has a central hollow portion 114. The central hollow portion 114 comprises a part penetrating through the insulating inner layers 164, 168 and 172 and the copper layers 162, 166, 170, 174 to provide a space for wire bonding. The chip 116 is adhered on the first copper layer 162 with a surface comprising devices (not shown) and bonding pads 120 formed thereon facing the smaller part of the central hollow portion 114. Preferably, the bonding pads 120 are aligned with the smaller part of the central hollow portion 114 to be exposed thereby. An adhering material 122, for example, thermally conductive paste or tape, with good electrical and heat conductivity and good flexibility is used to affix the chip 116 on the copper layer 162. Using a wire bonding method, the bonding pads 120 are connected to near ends 175a of the conductive traces 175 via bonding wires 124 made of materials such as gold, aluminum, or copper. On the other end 175b of the conductive traces 175, a solder ball 128, for example, a tin ball, is disposed. The central hollow portion is filled with a molding material 126, covering devices and regions nearby, including the bonding pads 120, the bonding wire 124, the surface 118 of the chip 116, the copper wires 124 and a part of the insulation layer 172.

Similar to the theory described in the first and the second embodiment, the embodiment provides a package structure with improved electric and thermal characteristics. For an integrated circuit with a large number of pins, multiple copper layers and vias are required to achieve the three dimensional layout of circuit. To insert a ground plane or source plane between copper layers, the electrical characteristic is improved with a reduced inductance and less signal noise. In addition, the efficiency of heat dissipation is enhanced. In other embodiments, the first copper layer 162 can also serve as a source plane, while the third copper layer serve as a ground plane to obtain the objectives of improving the electrical properties and the heat spread.

In summary, the advantages of the invention includes at least the following:

1) The chip is directly adhered onto a copper layer, so that the heat dissipation effect is improved due to the high thermal conductivity of copper. The product performance is consequently enhanced.

2) A ground plane or a source plane is inserted close to a neighboring copper layer comprising a signal circuit in the substrate. The signal transmission path is reduced, so that the signal noise is minimized. In addition, the mutual inductance is also reduced to shorten a signal delay, so that product performance is further improved.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A tiny ball grid array package structure, comprising:

a substrate, comprising an insulation inner layer covered by a first copper layer and a second copper layer on a first and a second surface of the insulation inner layer, respectively, the substrate having a central hollow and the second copper layer being patterned into a plurality of conductive traces;

a chip, having a first surface and a second surface wherein a plurality of bonding pads are formed in a center region of the first surface, the first surface of the chip being adhered onto the first copper layer such that the bonding pads are aligned with the central hollow portion;

a plurality of bonding wires, electrically connecting each of the bonding pads and a first end of each of the conductive traces;

a molding material, filling the central hollow and covering the bonding pads, the bonding wires, a first surface of the chip adjacent to the first copper layer, the first ends of the conductive traces and a part of the second surface of the insulation inner layer; and a plurality of conductive balls, disposed on a plurality of second ends of the conductive traces.

2. The package structure according to claim 1, wherein the conductive traces are connected to a ground plane.

3. The package structure according to claim 1, wherein the chip has a part of the second surface exposed.

4. The package structure according to claim 1, wherein the insulation inner layer further comprises a via of which an inner edge has a conductive metal layer to electrically connect the first copper layer and the conductive traces.

5. The package structure according to claim 1, wherein the insulation inner layer is made of a materials selected from a group consisting of bismaleimide-triazine and glass epoxy.

6. The package structure according to claim 1, wherein conductive balls comprise solder balls.

7. A tiny ball grid array package structure, comprising:
  a substrate, comprising a plurality of insulation inner layers, a first copper layer, a second copper layer and a third copper layer alternatingly laminated with each other, wherein the third copper layer is patterned into a plurality of conductive traces on a first side of the substrate, the first copper layer is disposed on a second side of the substrate electrically connected with one of the conductive traces, the second copper layer is electrically connected to the conductive traces, and the substrate further comprises a central aperture;
  a chip, having a first surface and a second surface, the first surface being connected to the first copper layer and having a central portion comprising bonding pads aligned with the central aperture and electrically connected to a first end of each of the conductive traces;
  a plurality of bonding wires, coupled with both the bonding pads and first ends of the conductive traces;
  a plurality of conductive balls on a second end of each of the conductive traces which are not coupled with the bonding wires; and
  a molding material filling the central aperture to cover the chip, the bonding pads, bonding wires, and the first ends of the conductive traces.

8. The package structure according to claim 7, wherein conductive traces connecting to the first copper layer are grounded.

9. The package structure according to claim 7, wherein conductive traces connecting to the second copper layer are connected to a power source.

10. The package structure according to claim 7, wherein the second surface of the chip is exposed by of the molding material.

11. The package structure according to claim 7, wherein the insulation inner layer comprises a via having an inner surface coated with a conductive metal layer, so that the second copper layer and the conductive traces are electrically connected, and the first copper layer is electrically connected with the conductive traces, as well.

12. The package structure according to claim 8, wherein the conductive traces connecting with the second copper layer are grounded.

13. The package structure according to claim 8, wherein the conductive traces connecting with the first copper layer are connected with a power source.

14. The package structure according to claim 7, wherein the insulation inner layer is made of a material selected from a group consisting of BT, FR-4 and FR-5.

15. The package structure according to claim 7, wherein the conductive balls comprise solder balls.

16. A tiny ball grid array package, comprising:
  a substrate, further comprising:
    a plurality of insulation layers,
    a plurality of copper layers comprising a first copper layer, a second copper layer, a third copper layer and a fourth copper layer;
    a hole, penetrating through the substrate near a central portion of the substrate; wherein
    one of the insulation layers is disposed between every two neighboring copper layers, the fourth copper layer is disposed on a first side of the substrate, the fourth and the second copper layers are patterned into a plurality of conductive traces, and the first copper layer being disposed on a second side of the substrate and electrically connected to the conductive traces of the fourth copper layer, while the second and the third copper layers are also electrically connected to the fourth copper layer;
  a chip, comprising a first surface and a second surface, the first surface being connected with the first copper layer with bonding pads formed in the first surface located within the hole, the bonding pads being electrically connected to a first end of the conductive traces of the fourth copper layer via a conductive wire;
  a molding material, filling the hole and covering a surrounding area of the hole to protect the bonding pads, the conductive wire, the conductive traces and a joint area of the chip and the first copper layer; and
  a plurality of conductive balls, each of which is formed on a far end of each of the conductive traces.

17. The package structure according to claim 16, wherein the conductive traces connecting to the first copper layer are grounded.

18. The package structure according to claim 16, wherein the conductive traces connecting to the third copper layer are connected to a power source.

19. The package structure according to claim 16, wherein the second surface of the chip is exposed by the molding material.

20. The package structure according to claim 16, wherein the insulation layer comprises at least a via having an inner surface coated with a conductive metal layer, so that the first copper layer, the second copper layer, the third copper layer and the fourth copper layer are electrically connected.

21. The package structure according to claim 16, wherein the conductive traces connecting to the third copper layer are grounded.

22. The package structure according to claim 16, wherein the conductive traces connecting to the first copper layer are a power source.

23. The package structure according to claim 16, wherein the insulation layer is made of material selected from a group consisting of BT, FR-4 and FR-5.

24. The package structure according to claim 16, wherein the conductive balls comprise solder balls.

* * * * *